ively mounted reflectors, each reflector being associated with a different one of the slots and being insertable into the waveguide by, for example, fingertip pressure. Actuation of the transducer by an electrical pulse causes an ultrasonic pulse to propagate down the waveguide. The pulse is reflected back to the transducer, by the stationary reflector or an inserted reflector, where a delayed pulse is caused to appear. The delay is related to the position along the propagation path of the inserted reflector or the stationary reflector. In a second and similar embodiment, a piezoelectric transducer is coupled to a resilient elongated waveguide, and selectable means are used to temporarily pinch the waveguide along its length. The means selected determine the delay time of pulses transmitted and reflected back to the transducer.

United States Patent [19]
Salem

[11] 4,193,049
[45] Mar. 11, 1980

[54] ULTRASONIC TOUCH CONTROL PANEL
[75] Inventor: Robert J. Salem, Danbury, Conn.
[73] Assignee: Deere & Company, Moline, Ill. GEN. ELEC. CO.
[21] Appl. No.: 914,526
[22] Filed: Jun. 12, 1978
[51] Int. Cl.² .................. G01D 21/00; H01P 1/02; H03H 7/30
[52] U.S. Cl. ...................... 333/141; 116/205; 219/413; 310/335; 116/137 A
[58] Field of Search .............. 116/137 A; 310/334, 310/335; 307/117; 333/30 R; 219/413; 200/181

[56] References Cited
U.S. PATENT DOCUMENTS

| | | | |
|---|---|---|---|
| 2,407,294 | 9/1946 | Shockley et al. | 310/334 X |
| 2,505,364 | 4/1950 | McSkimin | 310/334 |
| 2,826,745 | 3/1958 | Page | 333/30 R |
| 2,979,022 | 4/1961 | Adel | 116/137 A |
| 3,145,355 | 8/1964 | Wright | 310/334 |
| 3,155,926 | 11/1964 | Meitzler | 310/334 X |
| 3,834,233 | 9/1974 | Willis et al. | 73/290 V |
| 3,935,485 | 1/1976 | Yoshida et al. | 200/181 X |
| 3,940,637 | 2/1976 | Ohigashi et al. | 200/181 X |

*Primary Examiner*—Daniel M. Yasich

[57] ABSTRACT

In a first embodiment, a control device includes a housing having a serpentinely disposed channel and a cover, secured to the housing, which converts the channel into an ultrasonic waveguide. One end of the waveguide is bounded by a stationary reflector and the other end of the waveguide holds a piezoelectric transducer matched to the waveguide so as to provide therein, when actuated, a propagating transverse wave in the ultrasonic frequency range. The cover includes a plurality of slots communicating with the waveguide, each slot being located at a different position along the propagation path of the waveguide; and a plurality of resil-

15 Claims, 6 Drawing Figures

ULTRASONIC TOUCH CONTROL PANEL

BACKGROUND OF THE INVENTION

1. Field of the Invention

The subject invention generally relates to electromechanical control devices of the type used to provide electrical signals in response to operator-executed manipulations or inputs. In addition, the invention relates to control devices such as disclosed in co-pending U.S. Pat. application Ser. No. 914,527, an Ultrasonic Control Device, filed on June 12, 1978, on an invention by Robert J. Salem, the application having been assigned to the assignee herein, the General Electric Company.

2. Description of Prior Art

Prior art considered relevant to the invention disclosed hereinbelow is described in U.S. Pat. No. 3,834,233, which relates to apparatus for monitoring the surface level of liquid in a container. The apparatus disclosed includes an ultrasonic waveguide vertically extending into the container, the lower end of the waveguide being located so as to be below the lowest liquid surface expected to be measured. Vents in the waveguide cause the liquid surface within the waveguide to settle at the same level as the liquid surface in the container and, as described below, is monitored to provide the information desired. The waveguide supports at its upper end a transceiver which periodically generates pulses of ultrasonic vibrations, and, at a fixed distance below the upper end, an ultrasonic transducer, In operation, the ultrasonic pulses propagate down the waveguide and, as any given pulse moves down the waveguide, it strikes the transducer and continues towards the liquid surface where it is reflected back to the transceiver. The period of time between transmitted pulses is sufficient to allow the return of a reflected pulse to the transceiver before the next of the periodic pulses is transmitted. In response to incident pulses the transceiver and transducer provide electrical signals which are processed to provide a transit time ratio and, since the distance from the transceiver to the transducer is fixed, a periodic measure of the distance from the transceiver to the surface of the liquid in the container. Transit time ratios are processed by the apparatus so as to make the distance measurement independent of the speed of propagation of the pulses, which speed is sensitive to the temperature of whatever gas is located above the liquid level in the waveguide. The patent also discloses that the transducer can be replaced by a reflector and that reflected signals, from the reflector and liquid surface, incident on the transceiver can be similarly processed to provide a measure of distance to the liquid surface in the waveguide.

Persons involved in producing consumer products of the type wherein operation of the product requires one or more operator inputs are aware that potentiometer circuits, electrical switches and electrical switch arrays can be used to control product functions. These persons are also aware that these control devices are expensive to buy, make, or use and contribute substantially to the costs of manufacturing the products.

SUMMARY OF THE INVENTION

It is an object of the present invention to provide a control device which is inexpensive to manufacture or to incorporate in another product.

It is another object of the present invention to provide a control device which utilizes ultrasonic echo ranging as a primary means of retrieving command information supplied to the device by an operator.

It is yet another object of the present invention to provide a control device responsive to an applied electrical pulse for providing a delayed electrical pulse, the amount of delay being subject to control by an operator.

Briefly, a control device, according to the invention, includes: an ultrasonic waveguide; and an ultrasonic transducer coupled to the waveguide, the transducer being capable of providing, in response to an applied electrical pulse, an ultrasonic wave pulse which is suitable for propagation along a propagation path in the waveguide. Additionally, the device includes two or more selectable means for reflecting at least part of an ultrasonic wave pulse propagating along the propagation path, each of the selectable means being located for reflecting said at least a part of a propagating ultrasonic wave pulse back to the transducer from a different position along the propagation path. The transducer is capable of responding to such a reflected pulse to provide a delayed electrical pulse. Each delayed pulse occurs with a time delay, relative to an applied pulse, related to a selected one of the selectable means. Such time delays can be processed electronically to provide command signals to apparatus to be controlled.

As will become apparent, control devices incorporating the invention are, relative to functionally equivalent potentiometer circuits or switch arrays, inexpensive to manufacture.

BRIEF DESCRIPTION OF THE DRAWING

Additional objects and features of the invention will become apparent after the following description of devices incorporating the invention is considered in conjunction with the accompanying drawings, in which.

DESCRIPTION OF PREFERRED EMBODIMENTS

Figure 1:
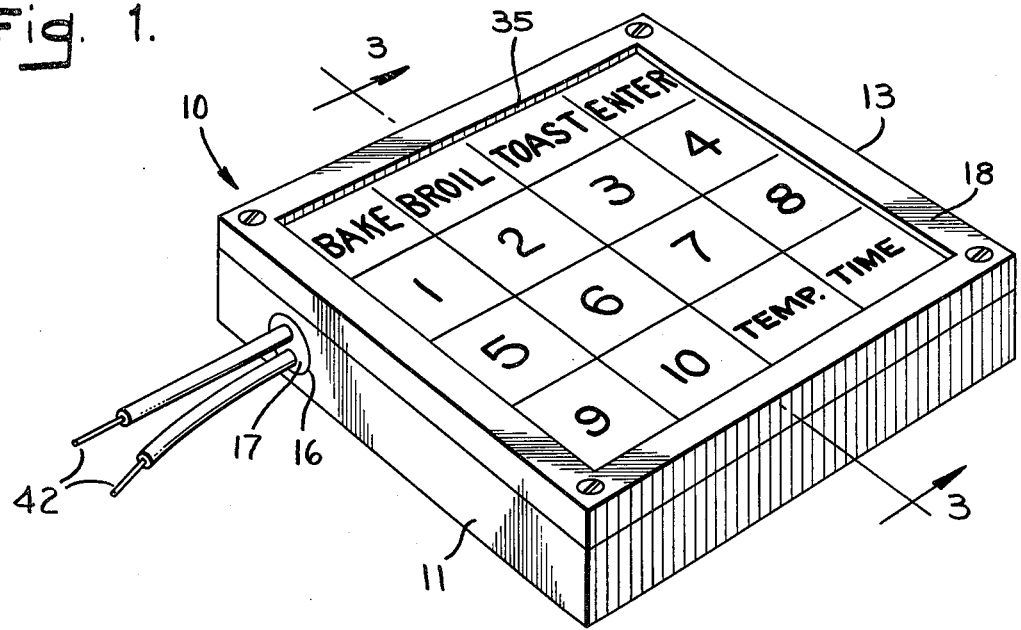
FIG. 1 is a perspective view of a control device, according to the invention.
Figure 2:
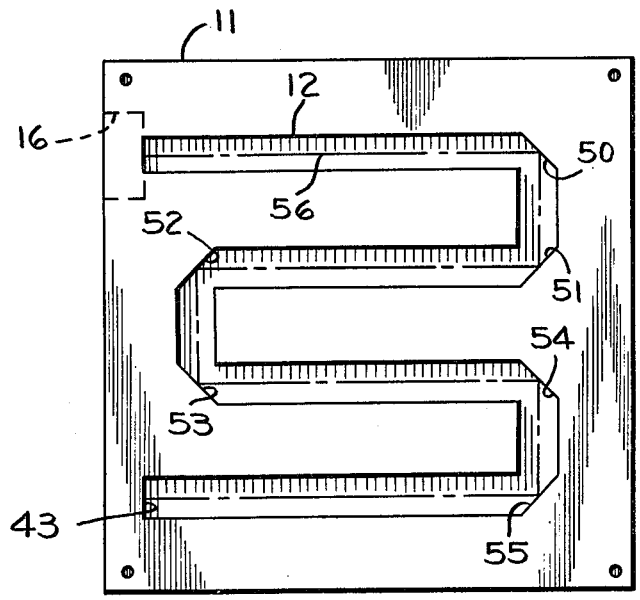
FIG. 2 is a top plan view of a housing of the control device.
Figure 3:
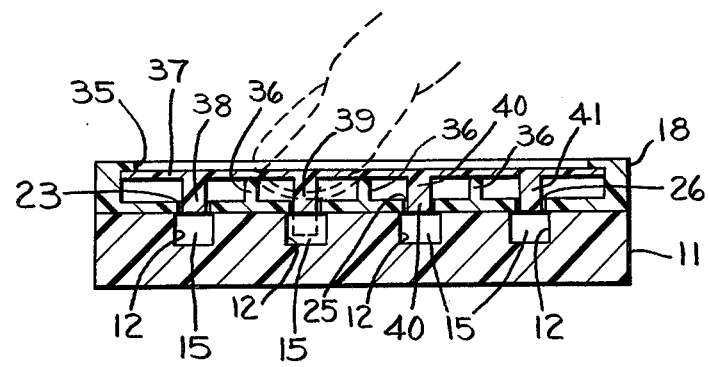
FIG. 3 is a cross-sectional view of the control device, taken along line 3—3 in FIG. 1.
Figure 4:
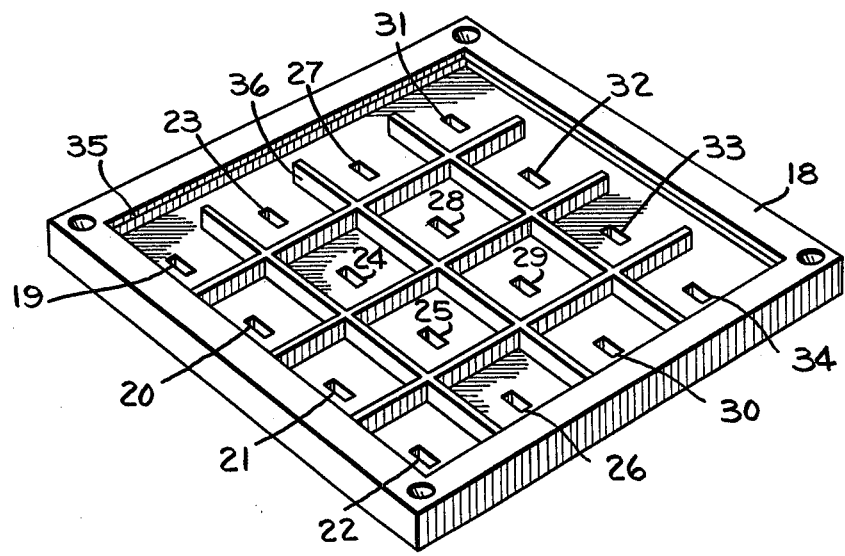
FIG. 4 is a perspective view of part of a cover of the device.

A control device 10 embodying the invention is shown in FIGS. 1, 2, 3, and 4. As shown in these figures, control device 10 includes a housing 11 having a channel 12, and a cover 13 secured to the housing. Cover 12 cooperates with the channel to provide an ultrasonic waveguide 15. One end of the waveguide communicates with a bore 16 in the housing, which bore is used to hold an ultrasonic transducer 17. In the embodiment, transducer 17 is a piezoelectric device matched to the waveguide so as to provide therein, when actuated, a propagating transverse wave in the ultrasonic frequency range. Cover 13 includes a member 18 having an array of slots 19–34 disposed such that when member 18 is attached to the housing the slots are aligned and in communication with linear sections of the waveguide. As shown in FIGS. 3 and 4, member 18 includes a lip 35 and a grid type projection 36 disposed between slots of the array. The lip and grid projection cooperate to support a resilient to sheet 37 having an array of projecting ultrasonic wave reflectors 38-41 (not all shown), each of the reflectors being disposed to extend into a different one of the slots. Finger tip pressure may be used to push any one of the reflectors into the waveguide, as is illustrated with dotted lines in FIG. 3, and when the pressure is removed the sheet returns to its original shape, thereby withdrawing the pushed reflector out of the waveguide. Actuation of transducer 17 by the application of an electrical pulse across wires 42 causes an ultrasonic wave pulse to propagate through the waveguide and, if a reflector has been inserted into the waveguide, the pulse is reflected back towards the transducer by the inserted reflector. During a typical mode of operation of the device, the transducer is actuated by a periodic pulse signal to produce propagating pulses and these pulses are reflected back to the transducer by a selected reflector. The reflected pulses cause corresponding electrical pulses to appear across wires 42, the pulses being delayed with respect to the activating signal by a time which is related to the location of the selected reflector. From the foregoing, it should be appreciated that the waveguide can be monitored continually to detect and identify the presence or insertion of any one of the reflectors by the periodic application of pulses to the transducer; and the detection and processing of corresponding electrical signals produced by the transducer. For this purpose, a piezoelectric transducer operating at 5Mhz. can be used to provide, in a waveguide having a propagation length of 225 millimeters, a periodic pulse having a width of 100 nanoseconds and a repetition rate of 10 pulses per second. Obviously, other parameters can be used, however, the repetition rate should be large enough to detect momentary insertions of reflectors into the waveguide.

Device 10 includes, as shown in FIG. 2, a stationary reflector 43 which is located at an end of the waveguide. Therefore, when ultrasonic pulses, as previously described, are caused to propagate through the waveguide by the transducer, if none of the reflectors projecting from sheet 37 are in the waveguide, the pulses will be reflected back to the transducer by the fixed reflector. The transmitted pulses which are returned to the transducer by reflector 43 travel a fixed distance along the propagation path of the waveguide and generate electrical pulses hereafter referred to as reference pulses. The velocity of propagation of ultrasonic pulses through waveguide 15 is temperature dependent and, therefore, measured delay times are related to the position of reflectors with respect to the propagation path in the waveguide but vary with temperature. Since the length of the propagation path is known, a delay time ratio between the delay time associated with reflector 43 and the delay time associated with an inserted reflector identifies the location of the reflector or the depression of a particular area on the sheet 37 with, assuming temperature uniformity in the waveguide, substantially temperature independent accuracy. If delay time ratios are used to detect insertions of reflectors, device 10 may be used in or adjacent to environments subject to large temperature variations, such as in the vicinity of an oven. Another advantage of processing delay time ratios is that for a unit length of waveguide more identifiable reflectors can be used. Reference pulses can be provided by a stationary reflector located at other than the end of the waveguide but the end is preferred because it can be a wall which also prevents entry of extraneous ultrasonic signals into the waveguide.

Referring to FIGS. 2 and 3, waveguide 15 has a serpentine configuration composed of orthogonally connected straight waveguide sections, each orthogonal connection including a reflecting surface 50-55 so as to define a piecewise linear propagation path 56 for pulses provided by the transducer. The use of a serpentine configuration for the waveguide results in a compact device.

As shown in FIG. 1, resilient sheet 37 includes depressable areas identified with indicia, each area being associated with a different one of the reflectors on sheet 37. The areas are depressable with finger tip pressure and, therefore, the device may be described as an ultrasonic touch control panel. The control device may be used in conjunction with electrical circuits to control products, such as a toaster oven; and, in the subject embodiment, the sheet 37 includes indicia related to cooking modes and numbers for setting magnitudes of cooking times and temperature. Suitable electrical circuits are well known in the art and may include apparatus for gating pulses to and from the transducer and means for processing delay time ratios to provide inputs to a microprocessor which controls product performance.

Figure 5:
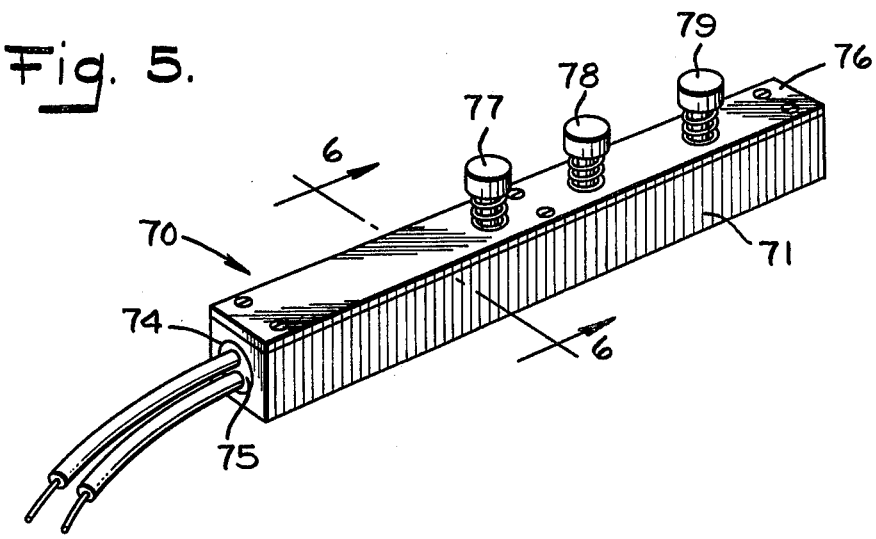
FIG. 5 is a perspective view of another control device, according to the invention.
Figure 6:
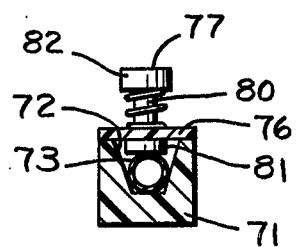
FIG. 6 is a cross-sectional view of said another control device, taken along line 6—6 in FIG. 5

Another control device 70 which can also be interrogated, for information supplied by an operator, with electrical pulses and embodying the invention is shown in FIGS. 5 and 6. As shown in these figures, device 70 includes an elongated housing 71 having a channel 72 which supports an ultrasonic waveguide 73 and a bore 74 which holds an ultrasonic transducer 75. Transducer 75 is coupled to one end of the waveguide, and is a piezoelectric device which is matched to the waveguide so as to provide therein, when actuated, a propagating transverse wave in the ultrasonic frequency range. Structurally, waveguide 73 is a circular tube manufactured from a resilient material. A cover 76 secured to the housing supports a number of spaced keys, 77-79, each of which may be used temporarily to pinch the tube at a different position along its length. When the tube is pinched or deformed by a key if pulses are transmitted by transducer 75 the pulses travel towards the pinched area and are reflected back towards the transducer. The reflected pulses incident on the transducer are delayed by a time period which is related to the location of the key along the length of the waveguide. The end of the waveguide remote from the transducer is closed so as to provide reference pulses in the same manner as wall 43 of device 10.

Each of the keys includes a stem 80 extending through the cover, an abutment 81 on an end of the stem which is inside of the housing, a button 82 on the other end of the stem, and a compression spring 83 located around the stem. The spring biases the abutment away from the tube. With this arrangement, when the tube or waveguide is pinched and the pinched key is released the tube does not have to drive the depressed key away from the housing and the tube returns to its unstressed state rapidly.

It should be apparent that devices 10 and 70 are similar in that they each have an ultrasonic waveguide, an ultrasonic transducer and selectable means for reflecting ultrasonic pulses propagating through the waveguide. It should also be apparent that the elements set forth above may take different forms without deviating from the spirit of the invention. Therefore, it is to be understood that the description herein of devices embodying the invention have been set forth as examples thereof and should not be construed or interpreted to provide limitations on the claims which follow and define the invention.

What is claimed is:

1. A control device of the type subject to control by an operator including a housing and comprising:
   (a) an ultrasonic waveguide provided with a plurality of indicia means on said housing representative of positions along said waveguide;
   (b) an ultrasonic transducer coupled to the waveguide, the transducer being capable of providing, in response to an applied electrical pulse, an ultrasonic wave pulse which is suitable for propagation along a propagation path in the waveguide; and
   (c) a plurality of selectable means for reflecting at least part of an ultrasonic wave pulse propagating along the propagation path, each of the selectable means being associated with an indicia means and located for reflecting at least a part of said propagating ultrasonic wave pulse back to the transducer from a different position along the propagation path, the transducer being capable of responding to such a reflected ultrasonic wave pulse to provide a delayed electrical pulse;
   whereby each delayed pulse occurs with a time delay, relative to an applied pulse, related to the position of a selected one of the selectable means relative to said transducer.

2. A control device, as defined in claim 1, further including a stationary reflector positioned along and perpendicular to the propagation path of the waveguide, whereby when an electrical pulse is applied to the transducer and at least part of a corresponding ultrasonic pulse is reflected by the said stationary reflector a delayed reference pulse is caused to appear at the transducer.

3. A control device, as defined in claim 2, wherein the stationary reflector is located at an end of the waveguide.

4. A control device, as defined in claim 1, wherein the waveguide includes a non-linear propagation path.

5. A control device, as defined in claim 4, wherein the propagation path has a serpentine configuration.

6. A control device, as defined in claim 4, further including a stationary reflector positioned along the path of the waveguide, whereby when an electrical pulse is applied to the transducer and at least part of a corresponding ultrasonic pulse is reflected by the stationary reflector a delayed reference ultrasonic pulse is caused to appear at the transducer.

7. A control device, as defined in claim 6, wherein the stationary reflector is located at an end of the waveguide and wherein the propagation path has a serpentine configuration.

8. A control device, as defined in claim 1, wherein at least one of the selectable means includes a reflector, the reflector being mounted for selectable movement into and out of the waveguide by means of said indicia means.

9. A control device, as defined in claim 8, further including a stationary reflector positioned along the propagation path of the waveguide, whereby when an electrical pulse is applied to the transducer and at least part of a corresponding ultrasonic pulse is reflected by the stationary reflector a delayed reference ultrasonic pulse is caused to appear at the transducer.

10. A control device, as defined in claim 9, wherein the stationary reflector is located at an end of the waveguide.

11. A control device, as defined in claim 8, wherein the waveguide includes a non-linear propagation path.

12. A control device, as defined in claim 11, further including a stationary reflector located at an end of the waveguide.

13. A control device, as defined in claim 1, wherein the waveguide is defined by resilient material.

14. A control device, as defined in claim 13, wherein at least one of the selectable means includes means for temporarily deforming the waveguide.

15. A control device, as defined in claim 14, further including means for reflecting ultrasonic pulses from an end of the waveguide.

* * * * *

UNITED STATES PATENT AND TRADEMARK OFFICE
CERTIFICATE OF CORRECTION

PATENT NO. : 4,193,049
DATED : March 11, 1980
INVENTOR(S) : Robert J. Salem

It is certified that error appears in the above-identified patent and that said Letters Patent are hereby corrected as shown below:

ASSIGNEE: should read GENERAL ELECTRIC COMPANY, NEW YORK, NY - not Deere & Company, Moline, IL Signed and Sealed this Tenth Day of June 1980

[SEAL]

Attest:

Attesting Officer

SIDNEY A. DIAMOND

Commissioner of Patents and Trademarks